United States Patent [19]
Chen et al.

[11] Patent Number: 5,906,683
[45] Date of Patent: *May 25, 1999

[54] LID ASSEMBLY FOR SEMICONDUCTOR PROCESSING CHAMBER

[75] Inventors: Aihua Chen, Fremont; Salvador P. Umotoy, Antioch, both of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/631,902

[22] Filed: Apr. 16, 1996

[51] Int. Cl.$^6$ ............ C23C 16/00; C23C 14/00; F28F 3/12
[52] U.S. Cl. ............ 118/724; 118/715; 204/298.09; 165/168; 165/169
[58] Field of Search .................. 118/724, 715; 204/298.07, 298.09; 165/168, 169, 908

[56] References Cited

U.S. PATENT DOCUMENTS

| | | | |
|---|---|---|---|
| Re. 15,608 | 5/1923 | Burroughs | 425/384 |
| 84,996 | 12/1868 | Colsten | 165/DIG. 496 |
| 840,295 | 1/1907 | Bryant | 165/499 |
| 1,213,349 | 1/1917 | Gebhard et al. | 165/164 |
| 1,571,929 | 2/1926 | Bronander | 165/168 |
| 2,116,896 | 5/1938 | Hudson | 165/168 |
| 2,133,348 | 10/1938 | Ferenci | 165/168 |
| 2,214,344 | 9/1940 | Paul | 165/169 |
| 2,506,118 | 5/1950 | Taylor | 156/168 |
| 2,571,949 | 10/1951 | Sandler | 165/168 |
| 3,711,681 | 1/1973 | Leuschner et al. | 219/303 |
| 3,848,665 | 11/1974 | Uerlichs et al. | 165/168 |
| 4,380,912 | 4/1983 | Edwards | 62/506 |
| 4,489,570 | 12/1984 | Little | 62/514 R |
| 4,747,450 | 5/1988 | Ikegame et al. | 165/168 |
| 5,000,113 | 3/1991 | Wang et al. | 118/723 E |
| 5,034,688 | 7/1991 | Moulene et al. | 324/158 F |
| 5,155,331 | 10/1992 | Horiuchi et al. | 219/121.43 |
| 5,192,849 | 3/1993 | Moslehi | 219/121.43 |
| 5,232,508 | 8/1993 | Arena et al. | 118/719 |
| 5,279,670 | 1/1994 | Watanabe et al. | 118/725 |
| 5,286,519 | 2/1994 | Vukelic | 427/99 |
| 5,292,554 | 3/1994 | Sinha et al. | 427/251 |
| 5,332,442 | 7/1994 | Kubodera et al. | 118/725 |
| 5,336,326 | 8/1994 | Karner et al. | 118/723 HC |
| 5,338,363 | 8/1994 | Kawata et al. | 118/725 |
| 5,356,476 | 10/1994 | Foster et al. | 118/725 |
| 5,422,139 | 6/1995 | Fischer | 427/248.1 |
| 5,425,812 | 6/1995 | Tsutahara et al. | 118/725 |
| 5,445,699 | 8/1995 | Kamikawa et al. | 156/345 |
| 5,453,124 | 9/1995 | Moslehi et al. | 118/715 |
| 5,478,396 | 12/1995 | Keck et al. | 118/719 |
| 5,525,160 | 6/1996 | Tanaka et al. | 118/728 |
| 5,558,717 | 9/1996 | Zhao et al. | 118/715 |
| 5,595,602 | 1/1997 | Harlan | 118/715 |
| 5,653,806 | 8/1997 | Van Buskirk | 118/715 |

FOREIGN PATENT DOCUMENTS

| | | | |
|---|---|---|---|
| 1353594 | 1/1963 | France | 165/168 |
| 4-30523 | 2/1992 | Japan | 118/724 |

OTHER PUBLICATIONS

Christensen, Water–Cooled Heat Transfer Plate, IBM Technical Disclosure Bulletin vol. 23 No. 4, pp. 1445–1446, Sep. 1980.

*Primary Examiner*—R. Bruce Breneman
*Assistant Examiner*—Jeffrie R. Lund
*Attorney, Agent, or Firm*—Blakely Sokoloff Taylor & Zafman

[57] ABSTRACT

A method and apparatus for controlling the temperature, maintaining the vacuum integrity and facilitating maintenance of a lid assembly (2) in a wafer processing apparatus. The apparatus comprises a gas distribution plate (42) defining one or more gas distribution holes (50) formed therethrough for passage of process gas(es), and a base plate (10) thermally coupled to the gas distribution plate. The base plate (10) has a gas inlet in communication with the gas distribution holes, a fluid inlet (98) for receiving a coolant fluid and a fluid outlet (102) for discharging the coolant fluid. A fluid passage (94) is formed through portions of the base plate in communication with the fluid inlet and outlet to allow a coolant fluid to flow therethrough and to transfer heat from the gas injection and distribution plates. The base plate is an integral, single piece that minimizes the use of gas seals in the lid assembly and facilitates disassembly and assembly of the lid assembly for cleaning and other maintenance.

24 Claims, 4 Drawing Sheets

LID ASSEMBLY FOR SEMICONDUCTOR PROCESSING CHAMBER

BACKGROUND OF THE INVENTION

The present invention relates to the fabrication of integrated circuits. More particularly, the invention provides a method and apparatus for controlling the temperature, maintaining the vacuum integrity and facilitating maintenance of a lid assembly for a semiconductor processing chamber.

High density integrated circuits, commonly termed VLSI devices, are typically formed on semiconductor wafers by subjecting the wafers to a number of deposition, masking, doping and etching processes. The wafers are placed on the upper surface of a pedestal or susceptor within a processing chamber, and process gas(es), such as tungsten hexafluoride and silane, are delivered into the chamber onto the wafer to perform the various deposition and etching steps. Typically, the process gases are directed through a manifold and mixed in a water-cooled gas mixing chamber within the manifold head. This cooling is often desired because the process gases may react to form a solid precipitate that deposits onto the walls of the manifold head at temperatures greater than a threshold temperature. After mixing in the cooled manifold head, the gaseous mixture is delivered through a lid assembly that includes one or more gas distribution plates for delivering a uniform distribution of the gaseous mixture into the deposition chamber onto the wafer.

During processing, the gas distribution plates of the lid assembly (i.e., the gas distribution plate or showerhead and the gas dispersion plate or blocker plate) receive heat from the gases flowing therethrough and from the heated wafer in the processing chamber. If these plates reach a threshold temperature, the process gases passing through the gas distribution system may react to form large particulates which clog the gas distribution holes of the plates. In addition, a layer of deposition may form on the inner surface of the plates to later flake off in large particulates that rain down on the wafer to create an uneven deposition layer, thereby contaminating the wafer.

The gas distribution plates of the lid assembly are typically mechanically coupled to a gas injection cover plate and a mounting plate, which are attached to a base plate for mounting to the processing chamber. The interfaces between these components are usually sealed with gas seals (e.g., O-rings) so as to maintain a vacuum-tight seal throughout the lid assembly. During installation of the lid assembly, however, it is often difficult to precisely align the gas seals within the corresponding grooves of the plates. In addition, the gas seal surfaces and grooves can be damaged from handling during this installation. A gas seal that has not been precisely installed or one that has been damaged during installation may contain a leak. This leak allows gas to pass through the lid assembly during processing, thereby disrupting the desired pressure within the processing chamber. Disruption of this desired pressure, which is typically on the order of 1–2 milliTorr, will adversely affect the deposition uniformity on the semiconductor wafer. Therefore, the gas seals must be repaired or reinstalled, or the entire lid assembly must be replaced when the vacuum integrity of its components has been compromised. Frequent reinstallation, repair or replacement of the lid assembly increases the manufacturing cost of the wafers and the downtime of the processing apparatus, which decreases the throughput of the process and further increases the manufacturing cost of the wafers.

Periodic cleaning and maintenance of the exposed surfaces of the processing chamber also increases the downtime of the processing apparatus. For example, the surfaces of the lid assembly that are exposed to process gases are typically cleaned periodically to remove deposition reactant from these exposed surfaces. To accomplish this, the lid assembly usually must be completely taken apart to separate the gas distribution plates from each other and to thereby access the exposed surfaces of these plates. Disassembling the lid assembly for cleaning takes a relatively long time. Moreover, reassembling the lid assembly after cleaning requires the gas seals and the gas distribution plates to be realigned, which can be a difficult, time-consuming process.

What is needed in the semiconductor manufacturing industry, therefore, is an improved lid assembly for a wafer processing apparatus. It would be desirable to maintain the temperature of the various components of the improved lid assembly below a threshold value to thereby avoid reaction and subsequent deposition of the processing gases on these components. In addition, the components of the lid assembly should be designed to minimize leakage of fluids therebetween to maintain a sufficient gas seal over the processing chamber. Furthermore, it would be desirable if the lid assembly were designed to facilitate cleaning of the surfaces that are exposed to process gases during processing.

SUMMARY OF THE INVENTION

The present invention provides a method and apparatus for controlling the temperature of a lid assembly in a wafer processing apparatus, such as a chemical vapor deposition chamber. In addition, the lid assembly of the present invention can be disassembled and/or reassembled relatively quickly and easily to facilitate cleaning and maintenance of the exposed surfaces of the lid. The present invention also provides an integral single-piece lid that minimizes fluid leakage to thereby maintain the vacuum integrity of the processing chamber.

In one aspect, the apparatus comprises a gas distribution plate defining one or more gas distribution holes formed therethrough for passage of process gas(es) and a base plate thermally coupled to the gas distribution plate. The base plate has a gas inlet in communication with the gas distribution holes, a fluid inlet for receiving a coolant fluid and a fluid outlet for discharging the coolant fluid. A fluid passage is formed through portions of the base plate in communication with the fluid inlet and outlet to allow a coolant fluid to flow therethrough. The coolant fluid convectively removes heat from the base plate which, in turn, conductively removes heat from the gas distribution plate. This convective and conductive cooling maintains the temperature of the gas distribution plate below a threshold value to thereby avoid reaction and subsequent deposition of the processing gases on the wall surfaces around the gas distribution holes.

In a specific configuration, the gas distribution plate is thermally coupled to the base plate with a plurality of mounting elements, such as screws, bolts or the like. The mounting elements generate a surface-to-surface contact between the gas distribution and base plates. Preferably, the fluid passage is formed adjacent to or near the mounting elements to facilitate conductive cooling of the gas distribution plate through the contacting surfaces of the gas distribution and base plate. The cooled base plate draws heat from the gas distribution plate to control the temperature of the surfaces around the gas distribution holes of the gas distribution plate. Controlling the temperature of the gas distribution holes inhibits gaseous reactions from occurring at these holes as process gases flow therethrough. This reduces clogging of the holes, and particulate contamination of wafers in the processing chamber is minimized.

In another aspect, the invention provides an integral single-piece lid or base plate that minimizes fluid leakage to thereby maintain the vacuum integrity of the processing chamber. The gas distribution and gas dispersion plates are mounted to a lower surface of the base plate so that the plates are positioned within the processing chamber. With this configuration, it is not necessary to seal the interface between the gas distribution and dispersion plates and the base plate. This reduces the number of gas seals in the lid assembly, thereby minimizing gas leaks during processing, which reduces the replacement time and increases the throughput of the process.

Another advantage of the present invention is that the lid assembly can be assembled and disassembled relatively quickly to facilitate cleaning and maintenance of the exposed surfaces of the lid assembly. The gas distribution and dispersion plates are removably coupled to the base plate via the mounting elements. Removing these plates allows the operator to access substantially all of the surfaces that are typically exposed to process gases during processing. Thus, these exposed surfaces can be cleaned without removing the base plate from the processing chamber. To assemble the lid assembly, the distribution and dispersion plates are simply fastened to the base plate with the mounting elements (i.e., without aligning O-rings or other gas seals with the plates). This minimizes potential damage to or misalignment of gas seals during reinstallation of the lid assembly.

The present invention achieves these improvements in the context of known process technology; however, further understanding of the nature and advantage of the present invention may be realized by reference to the specification and attached drawings.

DESCRIPTION OF THE SPECIFIC EMBODIMENTS

Figure 1:
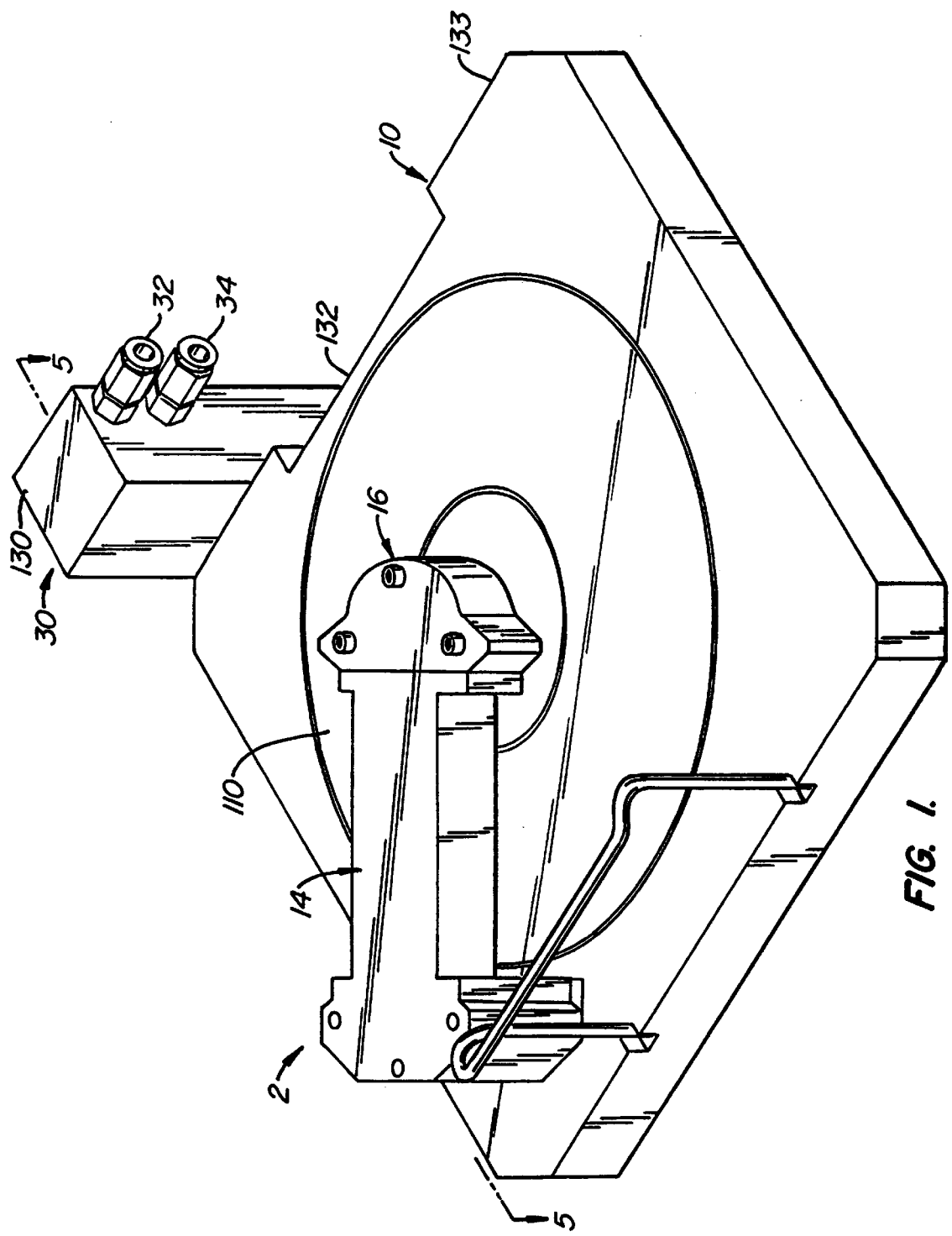
FIG. 1 is an isometric view of a lid assembly for a semiconductor processing chamber according to the present invention.

Referring to the drawings in detail, wherein like numerals indicate like elements, a lid assembly 2 for a semiconductor processing chamber (not shown) is illustrated according to the principles of the present invention. Lid assembly 2 may be used with a variety of processing chambers, such as chemical vapor deposition chambers. Preferably, lid assembly 2 will be used with processing chambers that utilize thermal processes to supply reactive gases to the substrate surface and primarily rely on heat-induced chemical reactions to produce a desired film. Lid assembly 2 is particularly useful in a vapor deposition apparatus of a multichamber processing system, such as the Precision 5000™ and the Centura 5200™ systems, all commercially available from Applied Materials, Inc. of Santa Clara.

Figure 2:
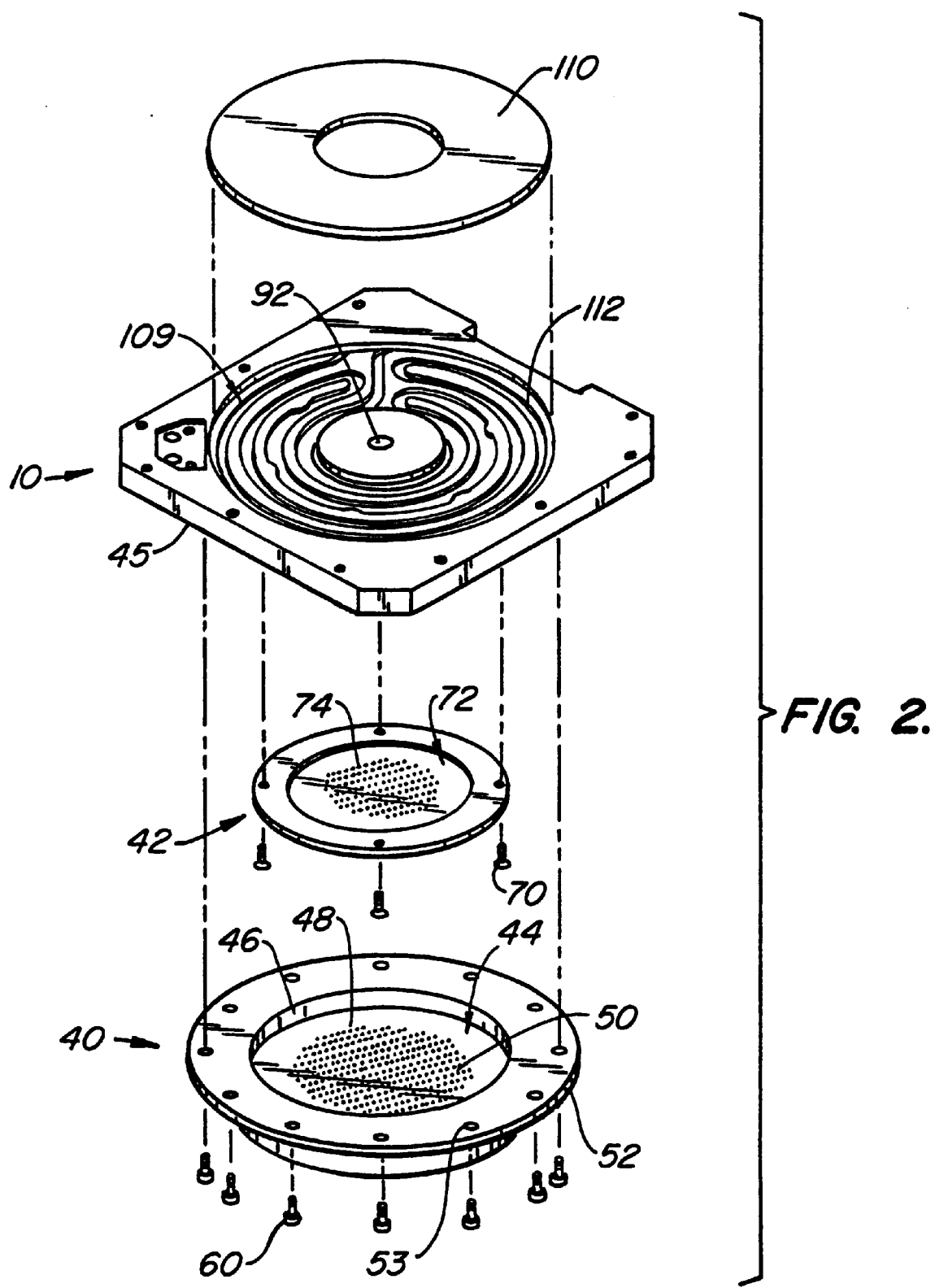
FIG. 2 is an exploded view of a base plate, a gas distribution plate and a gas dispersion plate of the lid assembly of FIG. 1.

Referring to FIGS. 1 and 2, lid assembly 2 generally includes a lid or base plate 10, a gas manifold 14, a coolant manifold 30, a blocker or gas dispersion plate 42 and a showerhead or gas distribution plate 40. As shown in FIG. 1, base plate 10 includes a recess 132 for receiving a hinge (not shown) for pivotally mounting base plate 10 and the entire lid assembly 2 to the mainframe body of the wafer processing apparatus (not shown). Gas manifold 14 is mounted to base plate 10 and has a manifold head 16 for mixing and injecting process gas(es) through plate 10 to the processing chamber (not shown). Coolant manifold 30 comprises a block 130 preferably mounted to a sidewall 133 of base plate 10 and defining a liquid inlet port 32 and a liquid outlet port 34. As described in more detail below, coolant fluid, such as water or a glycol/water mixture, will be introduced into inlet port 32 and delivered through coolant manifold 30 into base plate 10 to convectively and conductively remove heat from plates 10, 40 and 42 during processing. The coolant fluid is discharged from base plate 10 through manifold 30 and outlet port 34.

Figure 3:
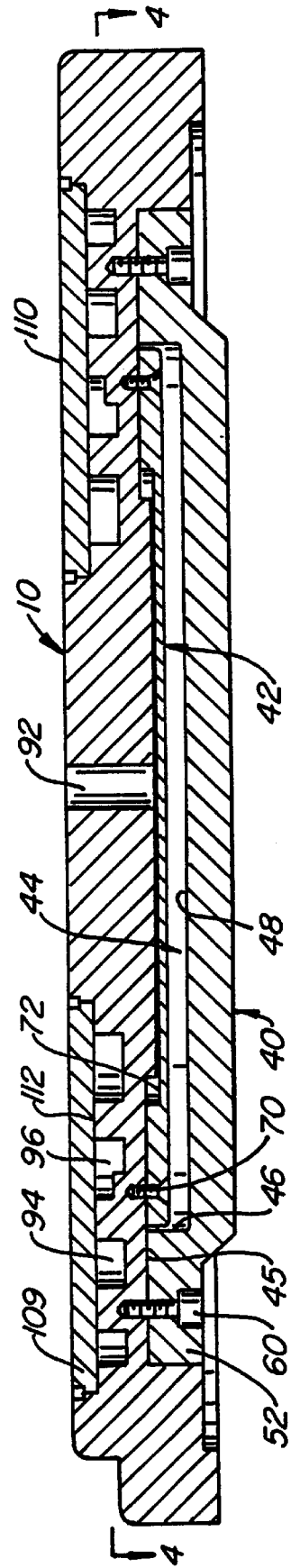
FIG. 3 is a side cross-sectional view of the base plate and the gas distribution and dispersion plates shown in FIG. 2.

As shown in FIGS. 2 and 3, gas dispersion plate 42 and gas distribution plate 40 are each directly fastened to a lower surface 45 of base plate 10. Preferably, gas distribution and dispersion plates 40, 42 are affixed to lower surface 45 of base plate 10 with a plurality of threaded mounting screws 60, 70, respectively. Mounting screws 60, 70 provide a relatively tight, surface-to-surface contact between contact surfaces 47, 49 of gas distribution and dispersion plates 40, 42, respectively, and lower surface 45 of base plate 10 to facilitate conductive heat exchange therebetween (discussed in greater detail below). The mounting screws 60, 70 comprise a process compatible material, such an nickel.

Gas distribution plate 40 is a generally dish-shaped device having a centrally disposed cavity 44 deemed by a side wall 46 and a base wall 48. A plurality of gas distribution holes 50 are formed through base wall 48 for distributing process gases therethrough onto a semiconductor wafer. The size and arrangement of holes 50 will vary depending on the process characteristics. For example, the holes 50 may be uniformly spaced to provide a uniform distribution of gases onto the wafer. On the other hand, holes 50 may be non-uniformly spaced and arranged, if desired. Holes 50 will usually have a diameter in the range of about 0.005 mm to 0.1 mm and preferably in the range of about 0.02 to 0.04 mm. As shown in FIG. 2, plate 40 further includes an annular flange 52 projecting outwardly in a horizontal plane from the upper portion of plate 40. Flange 52 includes a plurality of holes 53 for receiving mounting screws 60 to provide engagement of contact surface 47 of plate 40 with lower surface 45 of base plate 10.

Gas dispersion plate 42 is a generally circular disk defining a recess 72 for allowing gas passing through base plate 10 to disperse between lower surface 45 of base plate 10 and gas dispersion plate 42. Dispersion plate 42 further includes a plurality of gas dispersion holes 74 in communication with recess 72 for dispersing the gas therethrough into cavity 44 of gas distribution plate 40. Dispersion holes 74 will usually have a diameter of about 0.02 mm to 0.04 mm. Of course, it will be recognized by those skilled in the art that dispersion plate 42 may not be necessary for practicing the invention. The process gases may be passed directly from base plate 10 into cavity 44 of gas distribution plate 40, if desired.

Figure 4:
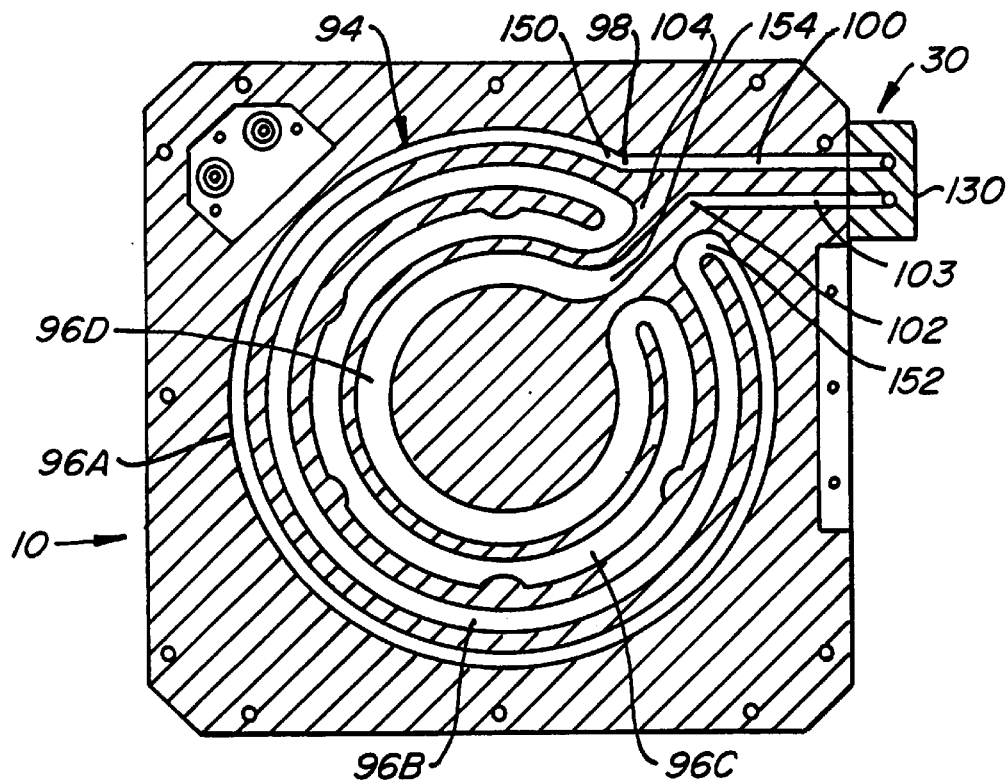
FIG. 4 is a top cross-sectional view of the base plate and gas distribution and dispersion plates of FIG. 2 taken along lines 4—4.

As shown in FIGS. 2–4, base plate 10 is an integral, single-piece element that functions to deliver process gas(es)

to gas dispersion plate 42 and to mount the entire lid assembly 2 to the mainframe unit of the processing chamber. Base plate 10 defines a central hole 92 in communication with gas manifold 14 for receiving the mixed process gases from manifold 14. Hole 92 is also in communication with recess 72 of gas dispersion plate 40 for dispersing the gas across plate 40 to holes 74. Base plate 10 further defines a coolant passage 94 for directing coolant fluid through portions of plate 10 to convectively cool these portions of plate 10. Preferably, coolant passage 94 is formed within portions of base plate 10 that are relatively close to mounting screws 60, 70. This facilitates conductive cooling through contact surfaces 47, 49 of dispersion and distribution plates 42, 40 and lower surface 45 of base plate 10.

As best shown in FIG. 4, coolant passage 94 preferably comprises a plurality of substantially annular channels 96 connected with each other to form a single, continuous fluid passage through base plate 10. Passage 94 will usually comprise between about two to thirty channels 96 and more preferably about three to eight channels 96. Coolant passage 94 has an inlet 98 in communication with a first passage 100 in coolant manifold 30 and an outlet 102 in communication with a second passage 103 in manifold 30. Passages 100, 103 are in communication with inlet and outlet ports 32, 34, respectively (FIG. 1), for receiving the coolant from a suitable coolant source and discharging the spent coolant. Base plate 10 further defines a channel blockage portion 104 located between the first and second passages 100, 103 for preventing the coolant liquid from travelling the short arc distance between the passages 100, 103, thereby compelling the coolant liquid to travel through channels 96.

In a specific configuration, an outer coolant channel 96A has a first end 150 in communication with first passage 100 and a second end 152 located on the other side of channel blockage portion 104 and in communication with a second coolant channel 96B located radially inward therefrom. Second coolant channel 96B, in turn, is in communication with a third coolant channel 96C on the other side of channel blockage portion 104. This configuration compels the coolant fluid to flow back and forth through coolant channels in opposite directions around base plate 10. The coolant will also flow radially inward as it passes between each channel 96. An innermost coolant channel 96D has an end 154 in communication with second passage 103 for discharging the spent coolant back into coolant manifold 30.

Referring to FIG. 4, channels 96 are radially spaced from each other across base plate 10 to form a substantially large, heat-exchanging surface area between the coolant flowing therethrough and base plate 10. Preferably, channels 96 are configured to increase the convective cooling of the portions of base plate 10 adjacent to or close to mounting screws 60, 70 to thereby increase the rate of conductive cooling through surfaces 47, 49 to gas dispersion and distribution plates 42, 40. To that end, the cross-sectional area of channels 96 will preferably become larger as they move radially inward so that the coolant will flow fastest around the outer channel 96A and will begin to slow as it passes through the inner channels 96B–96D. This configuration increases the rate of convective cooling to the plate 10 around mounting screws 60, 70. Usually, the cross-sectional of outer channel 96A will be about 0.03 mm² to 0.04 mm² and the cross-sectional area of inner channel 96B will be about 0.04 mm² to 0.05 mm².

It should be understood that the present invention is not limited to the configuration described above and illustrated in FIGS. 3 and 4. For example, passage 94 may comprise a number of separate, isolated fluid channels rather than a single, continuous passage.

Referring to FIG. 2, base plate 10 further defines an annular recess 109 surrounding central hole 92 and an annular cap 110 disposed within recess 109 fastened to base plate 10 above coolant passage 94. Preferably, annular cap 110 is E-beam welded to upper surface 112 of base plate 10 to provide a tight seal over passage 94, thereby effectively preventing coolant leakage from passage 96. With this configuration, passage 94 is formed relatively close to gas distribution and dispersion plates 40, 42. In addition, passage 94 is fabricated by forming a groove in the upper surface 112 of base plate 10, thereby decreasing the cost and complexity of manufacturing plate 10.

Figure 5:
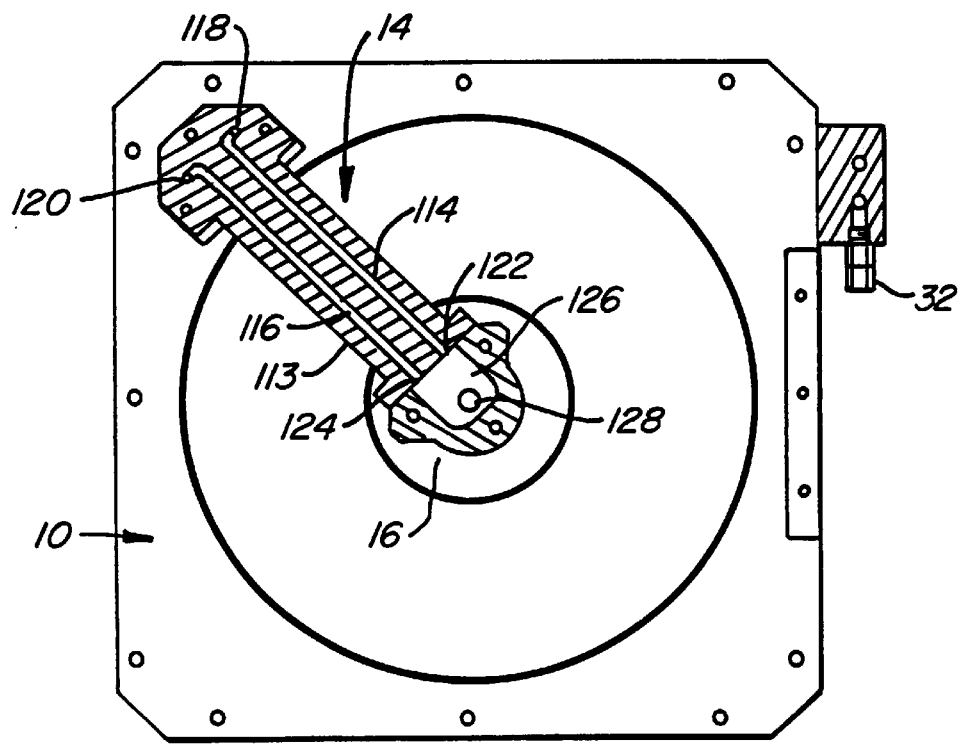
FIG. 5 is a top cross-sectional view of the lid assembly of FIG. 1 taken along lines 5—5.

Referring to FIG. 5, gas manifold 14 comprises a single, integral elongate body 113 coupled to manifold head 16. Elongate body 113 defines first and second inner gas passages 114, 116 extending therethrough into manifold head 16. Gas passages 114, 116 each have inlets 118, 120 suitably coupled to sources of gas, such as $WF_6$, $SiH_4$, dicholorosilane silane (DCS) or the like, and outlets 122, 124 in communication with a chamber 126 within head 16 for mixing the gases prior to delivering them through base plate 10. As shown in FIG. 1, manifold head 16 is fastened, e.g., bolted, to the top surface of base plate 10. Head 16 includes an outlet 128 communicating with chamber 126 and with central hole 92 within base plate 10 for dispersing the mixed gases into the gas distribution system.

When the present invention is in use, process gases are directed through passages 114, 116 in gas manifold 14 and mixed together in chamber 126 of manifold head 16 (see FIG. 1). The mixed gas is then delivered through hole 92 into recess 72 of gas dispersion plate 42, where it disperses outward and flows through holes 74 into cavity 44 of gas distribution plate 40 (see FIG. 2). The gas is then uniformly directed through gas distribution holes 50 onto the semiconductor wafer (not shown). The wafer is typically held above a critical temperature by a suitable heat source so that the two gases will react together at the wafer surface and deposit a layer thereon.

During this process, lid assembly 2 receives heat from the gases passing therethrough, from the heated semiconductor wafer and from the wafer heating source. To maintain the components of lid assembly 2 below the critical temperature and thereby avoid gas reactions and deposition on these components, a coolant liquid is introduced into inlet port 32 of coolant manifold 30. The liquid is directed along first passage 100 and through coolant passage 94, where it actively removes heat from base plate 10 (see FIG. 3). Specifically, the liquid coolant flows through outer channel 96A counterclockwise around base plate 10, and radially inward into channel 96B, where it reverses direction and flows clockwise through channel 96B. The coolant proceeds in this manner until it exits through second passage 102 and into coolant manifold 30, where it is discharged through outlet port 34.

The coolant will flow faster through the outer channel 96A than it flows through the other channels because this channel has a smaller cross-sectional area. In addition, the coolant will generally increase in temperature as it passes radially inward (as it receives heat from base plate 10). Accordingly, the rate of convective heat transfer will be the highest in the outer channel 96A, which directly overlies mounting screws 60, 70. Base plate 10 removes a large portion of heat from gas distribution and dispersion plates 40, 42 through mounting screws 60, 70 via surface conduction.

To clean the lid assembly 2, base plate 10 is pivoted open around a hinge (not shown) and mounting screws 60, 70 are unfastened and removed. Gas distribution and dispersion plates 40, 42 and gas manifold 14 are then removed from base plate 10. Plates 40, 42, and lower surface 45 and gas inlet 92 of base plate 10 can then be suitably cleaned to remove any oxide or other deposition thereon. Note that coolant manifold 30 and coolant passage 94 usually will not receive deposition because they are not exposed to process gases. Thus, all of the exposed surfaces of lid assembly 10 can be cleaned simply by removing gas distribution and dispersion plates 40, 42 and gas manifold 14 from base plate 10. To reassemble lid assembly 2, gas manifold 14 and plates 40, 42 are simply bolted back onto base plate 10 and the base plate 10 is closed over the enclosure. Since lid assembly 10 does not contain any O-rings or equivalent gas seals, there is no need to realign these O-rings with the plates in order to ensure effective vacuum integrity of the lid assembly.

While the above is a full description of the specific embodiments, various modifications, alternative constructions and equivalents may be used. Therefore, the above description and illustrations should not be taken as limiting the scope of the present invention defined by the appended claims. For example, it should be noted that the invention is not limited to a single-wafer chamber as described above and shown in the enclosed drawings. In fact, the lid assembly could be installed in batch chambers that simultaneously perform processing on a plurality of wafers. In addition, the invention would be suitable for use in a multi-wafer chamber that sequentially performs individual processing steps on each of the wafers.

What is claimed is:

1. A gas distribution system for a semiconductor processing chamber comprising:
   a gas distribution plate defining one or more gas distribution holes formed therethrough;
   a base plate thermally coupled to the gas distribution plate and defining a gas inlet in communication with the gas distribution holes, a fluid inlet for receiving a heat-exchanging fluid and a fluid outlet for discharging the heat-exchanging fluid; and
   a plurality of fluid passages formed in portions of the base plate in communication with the fluid inlet and the fluid outlet wherein the plurality of passages comprises a plurality of channels said channels having at least two different transverse cross-sectional areas.

2. The system of claim 1 wherein the plurality of fluid channels formed in the base plate receives a coolant therethrough to exchange heat with the base plate.

3. The system of claim 2 wherein the channels are in fluid communication with each other to form a continuous passage from the fluid inlet to the fluid outlet.

4. The system of claim 2 wherein the channels substantially circumscribe the gas inlet and are radially spaced from each other across the base plate.

5. The system of claim 2 wherein the channels are formed as grooves in an upper surface of the base plate.

6. The system of claim 1 further comprising one or more mounting elements coupling the gas distribution plate to the base plate for heat exchange between the base plate and the gas distribution plate.

7. The system of claim 6 wherein at least one of the channels is disposed adjacent to or near the mounting elements.

8. The system of claim 7 wherein said one of the channels has a transverse cross-sectional area that is smaller than a transverse cross-sectional area of the remainder of the channels to increase a rate of heat transfer near the mounting elements.

9. The system of claim 1 further comprising a gas dispersion plate disposed between the gas distribution plate and the base plate, the gas dispersion plate defining one or more gas dispersion holes in communication with the gas distribution holes and the gas inlet, the gas dispersion plate including one or more thermally conductive mounting elements coupling the gas dispersion plate to the base plate to facilitate heat exchange therebetween.

10. A lid assembly for a semiconductor processing chamber of the type having an enclosure defining a processing chamber and an opening comprising:
    an integral, single-piece base plate with a plurality of non-uniform cross section cooling channels formed therein wherein said base plate is used for sealing the opening of the enclosure, the base plate defining a lower surface for positioning within the sealed enclosure, a gas inlet and one or more mounting elements for mounting to the enclosure; and
    a gas distribution plate removably mounted to the lower surface of the base plate and defining one or more gas distribution holes formed therethrough to communicate the gas inlet with the processing chamber.

11. The assembly of claim 10 wherein the base plate seals the gas distribution plate within the enclosure.

12. The assembly of claim 10 further comprising a gas dispersion plate disposed between the gas distribution plate and the base plate, the gas dispersion plate being removably mounted to the base plate and defining one or more gas dispersion holes communicating the gas inlet with the gas distribution holes, the base plate sealing the gas dispersion plate within the enclosure.

13. The assembly of claim 12 further comprising a plurality of fasteners removably mounting the gas distribution and dispersion plates to the lower surface of the base plate.

14. An apparatus for fabricating an integrated circuit device comprising:
    an enclosure defining a processing chamber;
    a base plate mounted to the enclosure and defining a gas inlet, a fluid inlet for receiving a coolant fluid and a fluid outlet for discharging the coolant fluid;
    a plurality of fluid passages formed in portions of the base plate in communication with the fluid inlet and the fluid outlet wherein said plurality of fluid passages comprises a plurality of substantially annular inner and outer channels wherein the outer annular channels have a different cross-sectional area than the inner annular channels; and
    a gas distribution plate defining one or more gas distribution holes formed therethrough, the gas distribution plate being thermally coupled to the base plate such that the gas distribution holes communicate the gas inlet with the processing chamber.

15. The apparatus of claim 14 wherein the plurality of channels formed in the base plate receives a coolant therethrough to exchange heat with the base plate.

16. The apparatus of claim 14 further comprising one or more mounting elements coupling the gas distribution plate to the base plate for heat exchange therebetween.

17. The apparatus of claim 14 wherein the channels are in fluid communication with each other to form a continuous passage from the fluid inlet to the fluid outlet.

18. The apparatus of claim 17 wherein at least one of the channels is disposed adjacent to or near the mounting elements.

19. A method for controlling the temperature of a gas distribution plate in a semiconductor processing chamber comprising:

thermally coupling the gas distribution plate to a base plate; and directing a heat-exchanging fluid through a plurality of fluid passages and a plurality of non-uniform cross-section channels in the base plate.

20. The method of claim 19 further comprising the steps of:

transferring heat from the base plate to the heat-exchanging fluid; and transferring heat from the gas distribution plate to the base plate.

21. The method of claim 20 where in the second transferring heat step is carried out through surface contact by fastening the gas distribution plate to the base plate.

22. The method of claim 19 wherein the directing step comprises:

applying a coolant liquid to a liquid inlet in the base plate;

directing the coolant liquid through a plurality of channels within the base plate; and discharging the coolant liquid through a liquid outlet in the base plate.

23. The method of claim 19 further comprising:

thermally coupling a gas dispersion plate to the base plate between the base plate and the gas distribution plate; and transferring heat from the gas dispersion plate to the base plate through surface contact.

24. The method of claim 23 further comprising:

causing said heat exchanging fluid to flow at a first velocity in a first portion of said channels;

causing said heat exchanging fluid to flow at a second velocity in a second portion of said channels;

causing said first velocity to be greater than said second velocity; and causing said first velocity to occur adjacent to said thermal coupling between the base plate and the gas distribution plate.

* * * * *